United States Patent
Ong (10) Patent No.: US 8,075,953 B2
(45) Date of Patent: *Dec. 13, 2011

(54) THIN ORGANIC ALIGNMENT LAYERS WITH A BATCH PROCESS FOR LIQUID CRYSTAL DISPLAYS

(75) Inventor: Hiap L. Ong, Diamond Bar, CA (US)

(73) Assignee: Hiap L. Ong and Kyoritsu Optronics Co., Ltd (TW)

( * ) Notice: Subject to any disclaimer, the term of this patent is extended or adjusted under 35 U.S.C. 154(b) by 1278 days.

This patent is subject to a terminal disclaimer.

(21) Appl. No.: 11/607,246

(22) Filed: Dec. 1, 2006

(65) Prior Publication Data

US 2007/0202253 A1    Aug. 30, 2007

Related U.S. Application Data

(63) Continuation-in-part of application No. 11/227,570, filed on Sep. 15, 2005.

(51) Int. Cl.
*C23C 16/00* (2006.01)
*B05D 5/12* (2006.01)
(52) U.S. Cl. ........................ 427/248.1; 427/58
(58) Field of Classification Search ............... 427/248.1, 427/58
See application file for complete search history.

(56) References Cited

U.S. PATENT DOCUMENTS

| 5,759,643 | A  | * | 6/1998  | Miyashita et al. ........... 428/1.31 |
| 6,339,459 | B1 | * | 1/2002  | Ichikawa et al. ................ 349/95 |
| 6,352,594 | B2 | * | 3/2002  | Cook et al. .................... 118/724 |
| 6,461,437 | B1 | * | 10/2002 | Kubota et al. ................ 118/719 |
| 6,724,449 | B1 | * | 4/2004  | Andry et al. .................. 349/124 |
| 6,830,831 | B2 | * | 12/2004 | O'Neill et al. ................ 428/690 |

* cited by examiner

*Primary Examiner* — Timothy Meeks
*Assistant Examiner* — Kelly M Gambetta
(74) *Attorney, Agent, or Firm* — Silicon Valley Patent Group, LLP; Edward S. Mao (57) ABSTRACT

A method to form alignment layers on a substrate of an LCD is disclosed. The substrate is placed in a vacuum chamber and undergoes a purging process. The purging process heats the substrates and removes water vapor from the vacuum chamber. Specifically, the vacuum chamber is evacuated to a low pressure and refilled with a preheated inert gas. Evacuation of the vacuum chamber and refilling of the vacuum chamber is repeated several times. The alignment layer is then deposited using vapor deposition. Alternatively, plasma enhanced vapor deposition can be used for depositing the alignment layer. Furthermore, plasma cleaning prior to the deposition of the alignment layer can used clean the substrate.

40 Claims, 7 Drawing Sheets

THIN ORGANIC ALIGNMENT LAYERS WITH A BATCH PROCESS FOR LIQUID CRYSTAL DISPLAYS

RELATED APPLICATIONS

The present application is a Continuation-In-Part of and claims the benefit of U.S. Utility patent application Ser. No. 11/227,570 by Haip L. Ong, filed Sep. 15, 2005, and is incorporated herein in its entirety by reference.

BACKGROUND OF THE INVENTION

1. Field of the Invention

The present invention relates to liquid crystal displays (LCDs). More specifically, the present invention relates to methods and apparatus for forming organic alignment layers on a substrate for aligning liquid crystal molecules in multi-domain vertical alignment liquid crystal displays.

2. Discussion of Related Art

Liquid crystal displays (LCDs), which were first used for simple monochrome displays, such as calculators and digital watches, have become the dominant display technology. LCDs are used routinely in place of cathode ray tubes (CRTs) for both computer displays and television displays. Various drawbacks of LCDs have been overcome to improve the quality of LCDs. For example, active matrix displays (using thin-film transistors) replaced passive matrix displays to improve resolution, contrast ratio, viewing angle, response time and reduce ghosting.

Figure 1A:
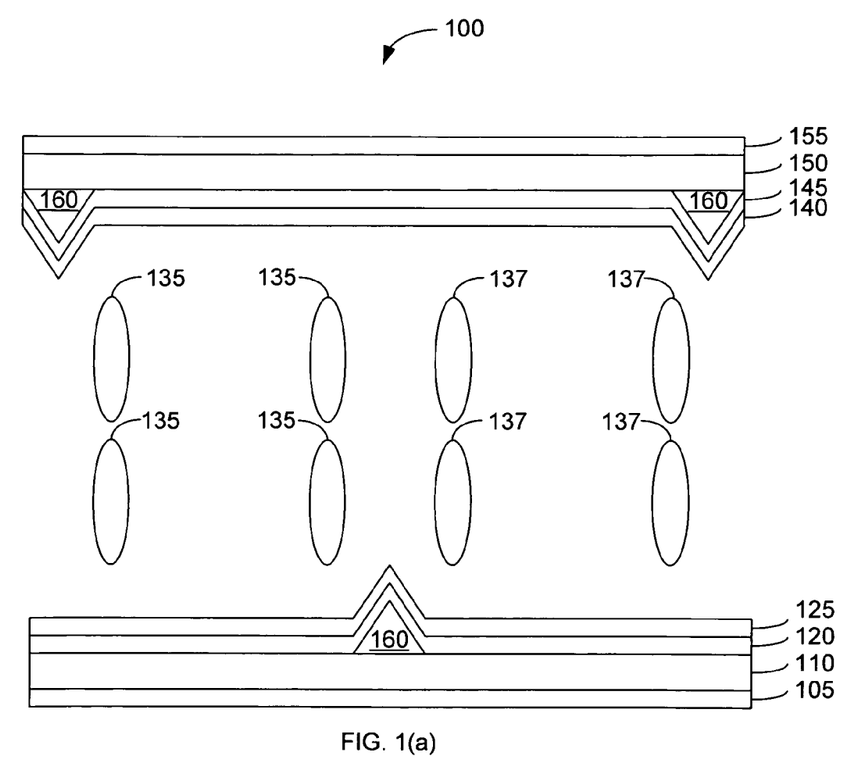
FIGS. 1(a)-1(b) are an illustration of a pixel of a conventional Multi-Domain vertical alignment LCD (MVALCD).
Figure 1B:
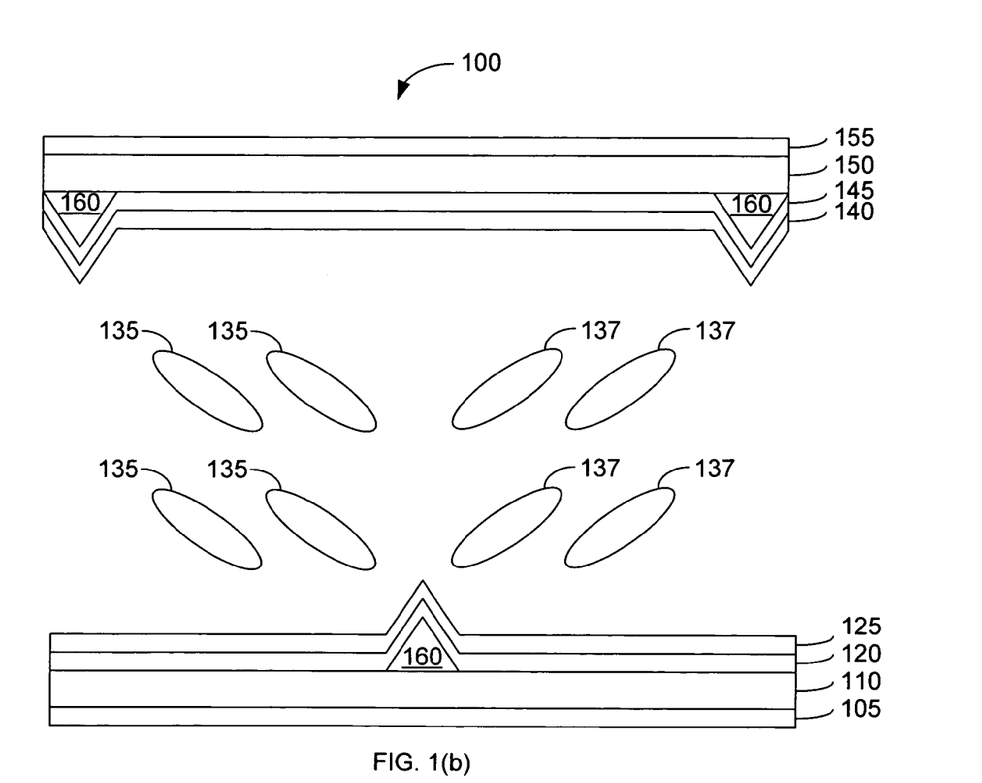

However, the primary drawbacks of conventional LCDs are the viewing angle is very narrow and the contrast ratio is low. Even the viewing angle of active matrixes is much smaller than the viewing angle of a conventional cathode ray tube (CRT) display. Specifically, a viewer directly in front of an LCD receives a high quality image; however viewers to the side of the LCD would not receive a high quality image. Multi-domain vertical alignment liquid crystal displays (MVALCDs) were developed to improve the viewing angle and contrast ratio of LCDs. However, the primary drawback of MVA LCDs is the high cost of manufacturing LCDs. FIGS. 1(a)-1(b) illustrate the basic structure and functionality of a pixel of a multi Multi-domain vertical alignment liquid crystal displays (MVALCDs) 100. For clarity, MVALCD 100 of FIGS. 1(a)-1(b) is described for grayscale operation.

MVALCD 100 has a first polarizer 105, a first substrate 110, a first electrode 120, a first alignment layer 125, liquid crystals 135, liquid crystals 137, a second alignment layer 140, a second electrode 145, a second substrate 150, a second polarizer 155, and protrusions 160. Alignment layers 125 and 140 are typically formed using a polyimide (PI) film coating. A light source (not shown) sends light from beneath first polarizer 105, which is attached to first substrate 110. The polarization of the first polarizer 105 is generally directed in a first direction and the polarization of the second polarizer 155 is directed perpendicularly to first polarizer 105. Thus, light from the light source would not pass through both first polarizer 105 and second polarizer 155 unless the polarization of the light were to be rotated by 90 degrees between first polarizer 105 and second polarizer 155. For clarity, very few liquid crystals are shown. In actual displays, liquid crystals are rod like molecules, which are approximately 5 angstroms in diameter and 20-25 angstroms in length. Thus, there are over 10 million liquid crystal molecules in a pixel that is 100 μm width by 300 μm length by 3 μm height.

In FIG. 1(a), liquid crystals 135 and 137 are vertically aligned. Specifically, alignment layers 125 and 140 align the liquid crystals in the desired resting position, which is a vertical alignment. In the vertical alignment, liquid crystals 135 and 137 would not rotate the polarization of the light from the light source. Therefore, second polarizer 155 blocks the light that was polarized in a first direction by first polarizer 105. Thus, pixels in MVALCD 100 can provide a completely optical black state. Consequently MVALCD 100 can provide a very high contrast ratio for all color and all cell gaps. As illustrated in FIG. 1(b), when an electric voltage is applied between first electrode 120 and second electrode 145, liquid crystals 135 and 137 reorient to a tilted position. Specifically, liquid crystals 135 tilt to the left to form a first domain while liquid crystals 137 tilt to the right to form a second domain due to protrusions 160. Liquid crystals in the tilted position rotate the polarization of the polarized light coming through first polarizer 105 by ninety degrees so that the light can then pass through second polarizer 155. The amount of tilting, which controls the rotation of the polarization of the light and thus the amount of light passing through the LCD (i.e., brightness of the pixel), is proportional to the applied voltage of the electric field. Having multiple domains (i.e. liquid crystals 135 and liquid crystals 137) increases the viewing angle of the MVALCD. Generally, a single thin-film-transistor (TFT) is used for each pixel. However for color displays, a color pixel is divided into 3 color components and a separate TFT is used for each color component (typically, Red, Green, and Blue)

The primary drawback of MVA LCDs is the high cost of manufacturing LCDs. While the material cost of polyimide is very low, the process to form of alignment layers 125 and 140 is very costly. Furthermore, conventionally polyimide processes are prone to dust and particle contamination and thus require expensive cleaning and process equipment. Reducing the fabrication cost of the alignment layer can greatly reduce the overall cost of manufacturing liquid crystal displays. In addition, conventional MVA alignment layer fabrication processes process a single wafer at a time, which results in a very low throughput.

Another common method to create alignment layers for MVA LCDs is the thermal evaporation of an inorganic material, such as $SiO_2$ (Silicon Dioxide) or SiO and SiOx (Silicon Monoxide), on the substrates in a high vacuum chamber. This process can produce a stable vertical LC alignment; however, the process uses a high vacuum chamber and is applicable to only small substrates (typically smaller than 10-in in size). The resulting LC alignment is sensitive to the surface cleanliness and topology, and strongly depends on the $SiO_2$ evaporation angle. Only certain evaporation angles can produce the desired LC alignment angle. Furthermore, this process also processes a single or at most a few wafers (typically, not more than 6 wafers) at a time. Thus, this process is not suitable for high volume batch processing and is not usable for substrates larger than 10-in. Furthermore, this process generally has a high rate of defect due to particle contamination at the surface. In addition alignment layers formed with silicon monoxide have humidity related reliability problems.

Hence there is a need for low cost processes and apparatuses to produce alignment layers in MVA liquid crystal displays. In addition the low cost processes should also allow multiple wafers to be processed simultaneously (i.e. batch processing).

SUMMARY

Accordingly, the present invention provides a low cost process and apparatus to manufacture alignment layer on a substrate for MVA liquid crystal displays. In accordance with one embodiment of the present invention, a substrate is placed in a vacuum chamber. The vacuum chamber is purged and then filled with an inert gas. The purging and filling of the vacuum chamber is repeated several times to remove water vapor from the vacuum chamber. Furthermore, in some embodiments of the present invention, the inert gas is preheated so that the substrate is warmed during the purging and refilling process. The alignment layer is then formed using vapor deposition of a silane material onto the substrate. Furthermore, batch processing of multiples wafers is easily accomplished using the present invention. For example, multiple wafers (generally 80-120 wafers) can be placed in the chamber together to accommodate fabrication of the alignment layers on all of the wafers simultaneously. Thus, the processes of the present invention produce very thin organic liquid crystal alignment layers at a high throughput rate and at a low cost.

Furthermore, embodiments of the present invention use an environmentally non-toxic material (1H1H2H2H-perfluorooctyltriethoxysilane), which has non-toxic MSDS (material safety and data sheet) properties, to produce vertical LC alignment. Most other silane materials are toxic and thus are not ideal for making LC alignment layers. However, by subjecting the silane materials to a chemical vapor deposition process, the final coated materials on the substrate can be rendered non-toxic. In addition, embodiments of the present invention use silane materials such as 1H, 1H,2H,2H-perfluorooctyltriethoxysilane, Trimethylsiyldiethylamine $C_7H_{19}SiN$, Octyltriethoxysilane, and trichlorosilane, that can adhere to ITO and other materials. These materials can be used to form liquid crystal alignment layers directly or used as an intermediate adhesive on ITO for other silanes that do not adhere to ITO. In particular, one embodiment of the present invention uses 1H, 1H, 2H, 2H-perfluorooctyltriethoxysilane due to its environmentally non-toxic properties, excellent MSDS properties, and high adhesion to ITO and other materials.

Furthermore, in some embodiments of the present invention, a plasma process is combined with the vapor deposition process. The plasma process provides plasma cleaning of the surface of the wafer before vapor deposition without exposing the wafer to gases that may contaminate the surface. In other embodiments, plasma-enhanced vapor deposition process is used to prepare the coating material and produce coated materials that provide vertical liquid crystal alignment. Plasma generation excites the chemical and produces a more vigorous reaction with the substrate. In addition, some embodiments of the present invention use materials such as $CF_4$ or hexafluoropropylene, to produce fluorinated polymer material $(CF_2—)_n$ that can adhere to ITO and other materials. These materials can be used to form liquid crystal alignment layers directly or used as an intermediate adhesive layer on ITO for other silanes that do not adhere to ITO.

The present invention will be more fully understood in view of the following description and drawings.

DETAILED DESCRIPTION

Figure 2:
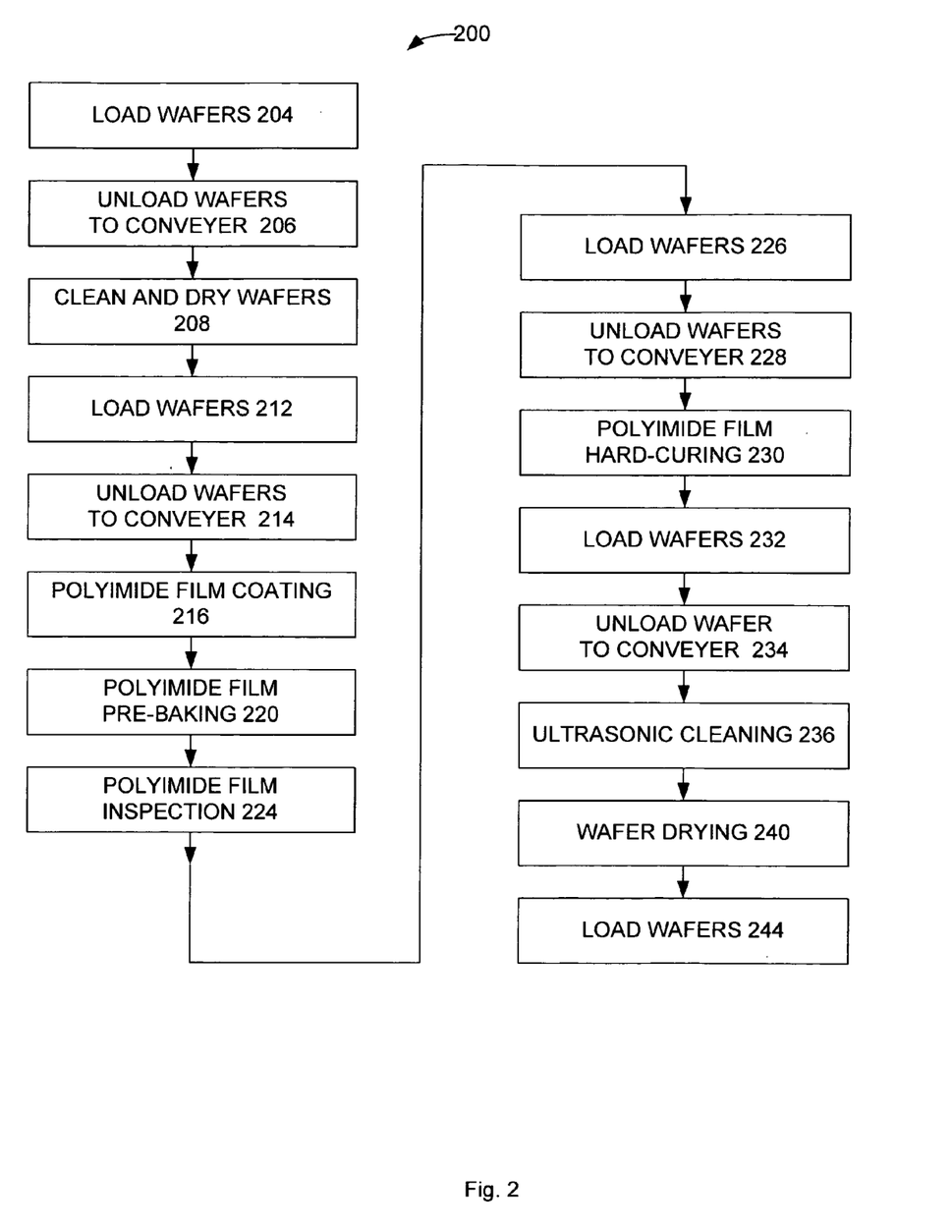
FIG. 2 is a process flow diagram of a conventional process to create an alignment layer for a MVALCD.

FIG. 2 is a process flow diagram of a conventional process 200 to form an alignment layer in a multi-domain vertically aligned liquid crystal display. Conventional process 200 requires the use of several different machines such as, wafer cleaning machine, a polyimide coating machine, a polyimide pre-curing oven, a polyimide post curing oven, an ultrasonic cleaning machine, and multiple loading/unloading machines. In the fabrication process, multiple wafers, which contain one or more substrates for LCDs, are loaded into cassettes, which are then placed in the machines for processing.

In LOAD WAFERS 204, wafers are loaded into a "cassette" and placed in a first loading/unloading machine. In UNLOAD WAFERS TO CONVEYER 206, the first loading/unloading machine unloads the wafers from the cassette and places them on a conveyer for the wafer-cleaning machine. The cleaning machine then cleans and dry the wafers serially in CLEAN AND DRY WAFERS 208. The wafers are then loaded in a second cassette by a second loading/unloading machine in LOAD WAFERS 212. The wafers in the second cassette are then unloaded onto a conveyer for the polyimide coating machine in UNLOAD WAFERS TO CONVEYER 214. In POLYIMIDE FILM COATING 216, the polyimide coating machine serially coats each wafer with a polyimide film. Each wafer is then transferred by the conveyer to a polyimide pre-baking oven, which serially pre-cures the polyimide film in POLYIMIDE PRE-BAKING 220

Each wafer is individually inspected in POLYIMIDE FILM INSPECTION 224. Wafers that do not pass inspection are removed. The wafers that pass inspection are loaded in a third cassette in LOAD WAFERS 226 in preparation for hard curing. The wafers are unloaded from the third cassette and placed on a conveyer for a polyimide hard-curing oven in UNLOAD WAFER TO CONVEYER 228. Then, the polyimide hard-curing oven cures the polyimide film on each wafer serially in POLYIMIDE FILM HARD-CURING 230. Then another loading/unloading machine loads the wafers from the polyimide hard-curing oven into a fourth cassette in preparation for wafer cleaning at LOAD WAFER 232. In UNLOAD WAFER TO CONVEYER 234, a loading/unloading machine unloads the wafers from the fourth cassette and places them on a conveyer for an ultrasonic cleaning and brushing machine. The ultrasonic cleaning and brushing machine processes the wafers serially with ultrasonic cleaning and brushing in ULTRASONIC CLEANING 236. The wafers are then dried in WAFER DRYING 240. Finally, a loading/unloading machine loads the wafers from the ultrasonic cleaning and brushing machine conveyer into a fifth cassette in LOAD WAFERS 244.

Thus, using conventional process 200 to create the alignment layer of an LCD involves multiple costly pieces of machinery and several labor-intensive or expensive automated loading and unloading steps. The machines used in conventional process 200, each can cost several million dollars. Furthermore, conventional process 200 consumes a large amount of water and creates a large amount of waste products and particles. In addition, many of the machines used in conventional process 200 can only process wafers serially, which leads to a very low throughput.

Figure 3A:
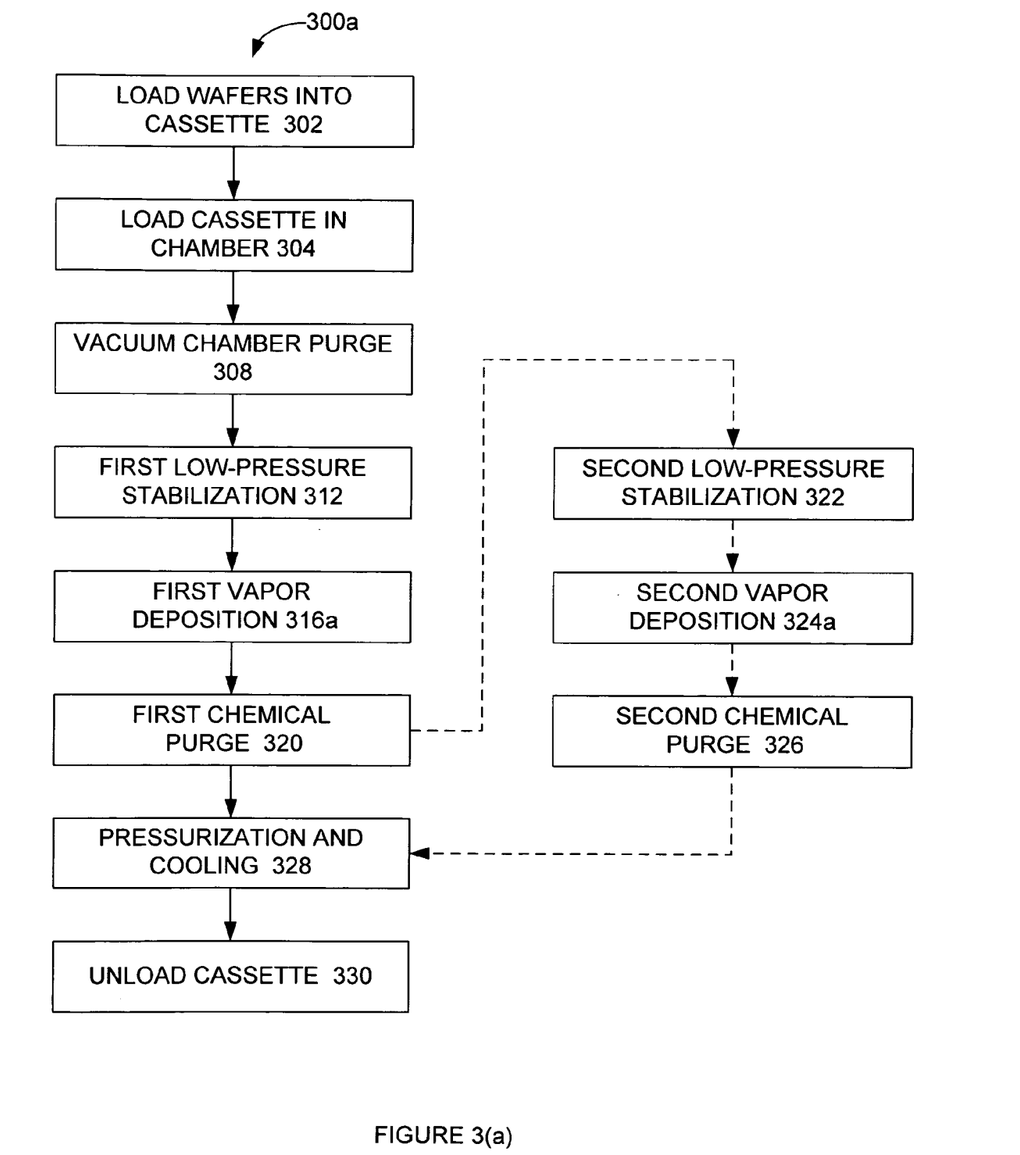
FIGS. 3(a) and 3(b) are two process flow diagrams of two processes to create an alignment layer for a MVA liquid crystal display in accordance with two embodiments of the present invention.

FIG. 3(a) is a process flow diagram of a novel process 300a to fabricate a liquid crystal alignment layer for MVALCD in accordance with one embodiment of the present invention. Novel process 300a is performed using a loading/unloading machine and a vacuum-bake/vapor prime coating machine. Vacuum-bake/vapor prime coating machines are available from a variety of sources, such as Model 1224 from Yield Engineering Systems Inc., of San Jose, Calif. In LOAD WAFERS INTO CASETTE 302, the wafers are loaded in a cassette. Then the loading/unloading machine loads the cassette into the vacuum-bake/vapor prime coating machine in LOAD CASSETTE IN CHAMBER 304. Model 1224 from Yield Engineering Systems can hold wafer up to a size of 16-in width×17-in length. Wafers with a larger size can be processed by constructing a larger coating machine based on the coating processes that are described in this invention. For example in one embodiment of the present invention, four cassettes each holding 20-25 wafers of very large dimension (for example, 150 cm×180 cm) can be placed in one coating chamber. Thus, in this embodiment 80 to 100 wafers of very large dimension are processed simultaneously in one deposition process.

In VACUUM CHAMBER PURGE 308, a vacuum chamber purge process is performed to completely remove water vapor that may be present in the vacuum chamber or the wafers. Specifically, the vacuum chamber is evacuated to a low pressure, such as 10-30 millitorrs, and refilled with a pre-heated inert gas, such as nitrogen, at a temperature of 80-200° C. The evacuation/refilling with nitrogen can be repeated several times to insure complete removal of water vapor from the vacuum chamber. Furthermore, due to the preheated inert gas and by the thermal heating element in the oven, the wafers are brought to a temperature that facilitates vapor deposition (as described below).

Then, in FIRST LOW-PRESSURE STABILIZATION 312, the vacuum chamber is held at a low pressure (for example 1 torr) for approximately 10 minutes. FIRST LOW-PRESSURE STABILIZATION 312 allows the entire wafer to be heated to the same temperature. Thus, thicker wafers should be held in the low-pressure process longer than thinner wafers.

The actual alignment layer is formed in FIRST VAPOR DEPOSITION 316a and an optional SECOND VAPOR DEPOSITION 324a. Depending on the specific embodiment of the present invention, vapor deposition can involve such techniques as chemical vapor deposition, physical vapor deposition, or a combination of both chemical vapor deposition and physical vapor deposition. However, in most embodiments of the present invention, the vapor deposition process involves at least some chemical reactions. For example, in some embodiments of the present invention, silane chemicals are pumped directly from a source bottle to the vaporization chamber. To minimize chemical degradation, the source bottle could be evacuated of gasses and filled with an inert gas, such as nitrogen, prior to transference of the silane chemicals to the vaporization chamber. The parameters used in FIRST VAPOR DEPOSITION 316a varies depending on the chemicals used. However, typical times and temperature are 5 to 10 minutes at 150 degrees Celsius. During FIRST VAPOR DEPOSITION 316a the chemical or chemicals are introduced by metered amount to the vapor flask and immediately to the chamber. Various silane materials can be used, such as amino silanes, epoxy silanes, and mercapto silanes. These silane materials can be used to fabricate vertical and parallel LC alignments. In one embodiment of the present invention the silane chemical is a 100% pure material of 1H, 1H, 2H, 2H-Perfluorooctyltriethoxysilane. In another embodiment of the present invention the silane chemical is a 100% pure material of Trimethylsiyldiethylamine. Other suitable silane materials include Trichlorosilane, 3-Aminopropyltriethoxysilane, Octyltriethoxysilane, Dimthyle octadecyl[3-(trimethoxysilyl) propyl]ammonium chloride (DMOAP), Dimethyldichlorosilane, and L-alpha-phosphatidylcholine. These chemicals are available from Alfa Aesar (a Johnson Mathey Company) of Windham, N.H. and/or Sigma-Aldrich Corp of St. Louis, Mo.

After FIRST VAPOR DEPOSITION 316a, the vacuum chamber is purged of chemicals in FIRST CHEMICAL PURGE 320. Specifically, the vacuum chamber is purged and refilled with an inert gas, such as nitrogen, several times to remove the vapors. A vapor trap on the vacuum exhaust line can be used to prevent silane chemicals from entering the vacuum pump. If a second vapor deposition step (i.e., SECOND VAPOR DEPOSITION 324a), is not used, SECOND LOW-PRESSURE STABILIZATION 322, SECOND VAPOR DEPOSITION 324a and SECOND CHEMICAL PURGE 326 are omitted. Then, the vacuum chamber is brought to normal pressurization and allowed to cool if necessary in PRESSURIZATION AN COOLING 328. Then, the cassette is unloaded by the loading/unloading machine in UNLOAD CASSETTE 330.

However, if a second vapor deposition step is desired, the vacuum chamber is evacuated and held at a low pressure (for example 1 torr) for approximately 10 minutes in SECOND LOW-PRESSURE STABILIZATION 322. SECOND LOW-PRESSURE STABILIZATION 332 allows the entire wafer to be heated to the same temperature. In SECOND VAPOR DEPOSITION 324a, chemicals are pumped directly from a source bottle to the vaporization chamber in the same manner as described above with respect to FIRST VAPOR DEPOSITION 316a. After SECOND VAPOR DEPOSITION 324a, the vacuum chamber is purged of chemicals in SECOND CHEMICAL PURGE 326. Specifically, the vacuum chamber is purged and refilled with an inert gas, such as nitrogen, several times to remove the vapors. The vacuum chamber is brought to normal pressurization and allowed to cool if necessary in PRESSURIZATION AN COOLING 328. Then, the cassette is unloaded by the loading/unloading machine in UNLOAD CASSETTE 330. With the two vapor deposition process, the second chemical can be laid top of the first chemical with no interaction between the vapors. However, in some embodiments of the present invention FIRST CHEMICAL PURGE 320 is omitted. When FIRST CHEMICAL PURGE 320 is omitted, the first chemical injected during FIRST VAPOR DEPOSITION 316a and the second chemical injected during SECOND VAPOR DEPOSITION 324a may mix and/or interact to form a new chemical layer. In most MVALCDs, the electrodes are typically constructed using Indium Tin Oxide (ITO) and Indium Zinc Oxide (IZO), which are transparent conductive materials. Most silane materials do not adhere to ITO or IZO. For example, the silane material DMOAP adheres to a glass substrate but does not adhere to ITO or IZO. However, 1H 1H 2H 2H-perfluorooctyltriethoxysilane, Trimethylsiyldiethylamine, Octyltriethoxysilane, and trichlorosilane do adhere very well to ITO and IZO. In addition many of the materials that do not adhere to ITO or IZO, do adhere to 1H, 1H, 2H, 2H-perfluorooctyltriethoxysilane, Trimethylsiyldiethylamine, and trichlorosilane. Thus, in some embodiments of the present invention, in FIRST VAPOR DEPOSITION 316a a more adhesive alignment layer material, such as 1H 1H 2H 2H-perfluorooctyltriethoxysilane, Octyltriethoxysilane, or trichlorosilane, is deposited over the ITO or IZO electrodes. Then, in SECOND VAPOR DEPOSITION 324a, a second alignment layer material, which is deposited over the more adhesive material, is used to form the liquid crystal alignment layer.

Furthermore, in some embodiments of the present invention, plasma processes are combined with the vapor deposition process. Specifically, a suitable plasma system is installed to perform plasma cleaning on the substrates prior to the vapor prime process or to perform plasma-enhanced vapor deposition process. The plasma generation excites the chemical and may cause it to react more vigorously with the substrate. Suitable plasma systems are available from CVD and PECVD process equipment vendors, such as the Model 1224P from Yield Engineering Systems.

Figure 3B:
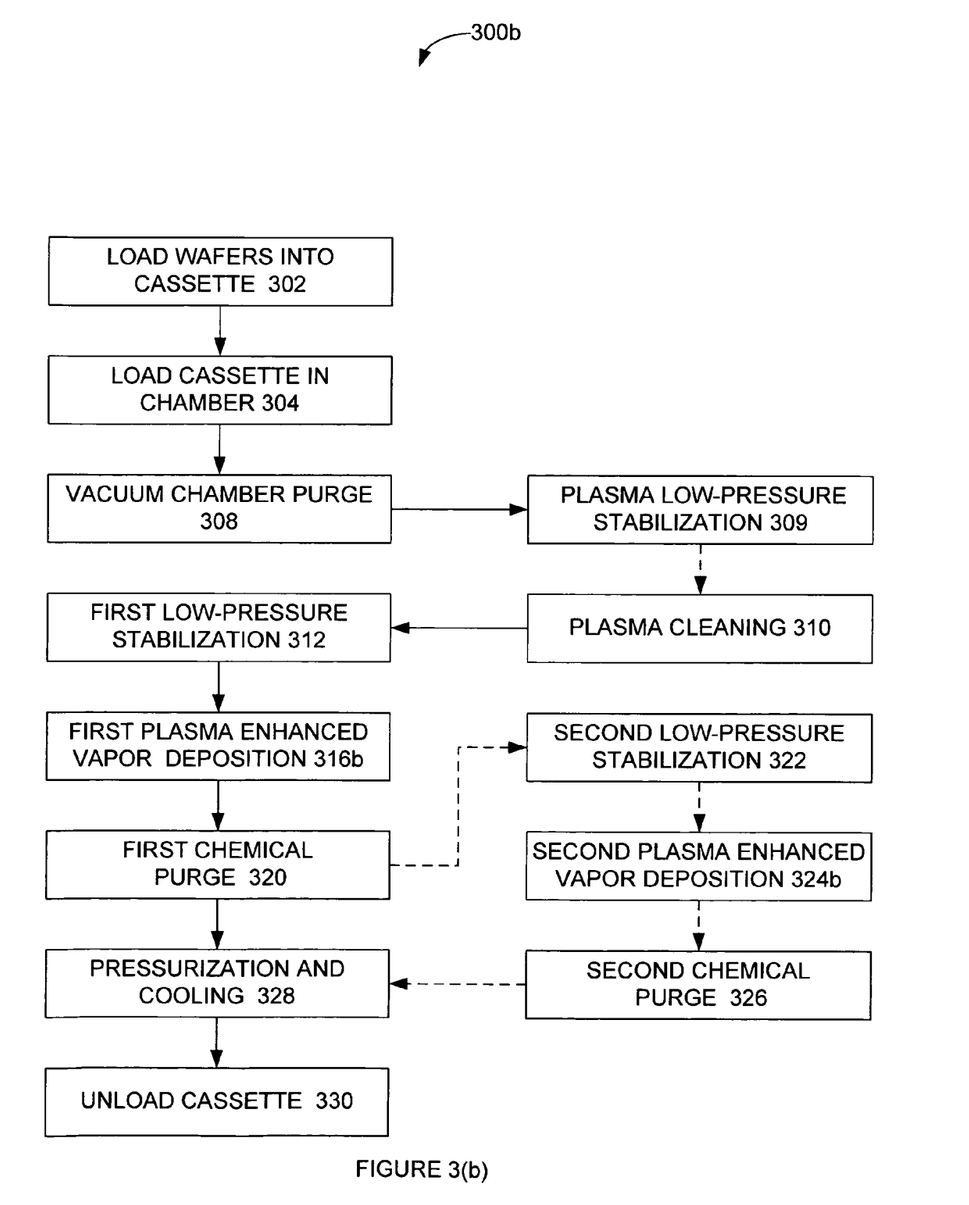

FIG. 3(b) shows a process 300b that includes plasma processes in accordance with some embodiment of the present invention. Because process 300b is similar to process 300a of FIG. 3(a) only the differences are described. Specifically, after VACUUM CHAMBER PURGE 308, the vacuum chamber is held at a low pressure (for example 100 millitorrs to 300 millitorrs) for approximately 10-20 minutes in PLASMA LOW-PRESSURE STABILIZATION 309 in preparation for plasma cleaning.

Then in PLASMA CLEANING 310, a plasma cleaning process is used to clean the substrates. Typically, a downstream process is used in the plasma cleaning process. For example, the hydrogen process described U.S. Pat. No. 6,203,637, entitled "Use of a cleaning process, a leaning process, a connection process and a workpiece pair", by Dommann, et al., is used in some embodiments of the present invention. In other embodiments of the present invention, the plasma cleaning process involves backfill with the process gas of Argon or Oxygen (or other gas). In other embodiments of the present invention, the plasma cleaning process involves a low pressure DC plasma generated by a hot filament. The low-energy ions and radicals of the plasma react with surface contaminants to form volatile compounds. In still other embodiments of the present invention, plasma physical cleaning (i.e. sputtering) can also be used for the plasma cleaning process.

By combining the plasma cleaning process and the vapor deposition process in one piece of equipment, substrates can be plasma treated before the vapor deposition without exposure to gases (such as the atmosphere) that may contaminate the substrates because the substrates are not open to atmosphere and are not transferred to different equipment.

In addition to plasma cleaning, process 300b also uses plasma enhanced vapor deposition. Specifically, FIRST VAPOR DEPOSITION 316a is replaced by FIRST PLASMA ENHANCED VAPOR DEPOSITION 316b. In embodiments of the present invention, a plasma is struck during FIRST PLASMA ENHANCED VAPOR DEPOSITION 316b. Specifically, plasma generation excites the chemicals and causes the chemicals to react more vigorously with the substrate. In some embodiments of the present invention, the plasma enhanced vapor deposition process also includes lowering the pressure to a little less than 100 mTorr, then backfilling with the process gas. In addition, in some embodiments of the present invention, the excitation of the process gas can be accomplished by a plasma source outside the vapor deposition coating chamber. In other embodiments the plasma source is inside the vapor deposition coating chamber. Plasma enhanced vapor deposition is well suited for hexafluoropropylene (HFP) gas. Thus, embodiments of the present invention can maintain the low cost and wafer scale of the vapor deposition process with the ability to use a PE-CVD coating process. In process 300b, SECOND PLASMA ENHANCED VAPOR DEPOSITION 324b, which is similar to FIRST PLASMA ENHANCED VAPOR DEPOSITION 316b as described above, replaces SECOND VAPOR DEPOSITION 324a. Although process 300b shows plasma cleaning, and plasma enhanced vapor deposition, other embodiments of the present invention may use plasma cleaning without plasma enhanced vapor deposition, and still other embodiments of the present invention may use plasma enhanced vapor deposition without plasma cleaning.

Using plasma enhanced chemical vapor deposition in accordance with the present invention; allows the deposition of fluorinated polymer materials, such as $CF_4$, $CF_X$, and $CF_2-CF_2-CF_2\ldots$ (i.e. $(CF_2-)_n$). These materials are well suited for vertical liquid crystal alignment layers, are non-toxic, and do not have residue ions or residue charges. Various starting materials can be used in the present invention, for example, one embodiment of the present invention uses $CF_4$, and second embodiment of the present invention uses HFP (hexafluoropropylene, $C_3F_6$). In another embodiment of the present invention, the reaction is enhanced by a small amount of $H_2$ with either $CF_4$ or HFP. Other embodiments of the present invention may use CFx materials such as Fluorinated polymer film and fluorinated monomers, such as fluoroalkyls, fluorohydroalkyls, cyclo-fluoroalkyls, fluorobenzene, and unsaturates.

Thus, novel processes in accordance with the present invention produces an alignment layer using less equipment than conventional techniques and requires less labor or less automated equipments (i.e. to load and unload wafers). The equipment cost to implement the process of the presenting invention is estimated to be only 20% of the cost of equipment required by conventional processes to form alignment layers in liquid crystal displays. Furthermore costs are reduced because chemical wastage and water wastage are greatly reduced. In addition, because fewer machines are required, factory space requirements are also greatly reduced.

Another advantage of processes in accordance with the present invention is batch processing of wafers. As described above, several portions of the conventional PI alignment process handle wafers serially (i.e. one at a time). Thus, the present invention has a much higher throughput than conventional methods. The high throughput can reduce the alignment layer fabrication cost, and the batch process can lower the process cost and material cost.

In addition to the cost advantage of the present invention, the resulting alignment layers and wafers produced using the teachings of the present invention offer several functional advantages over conventional alignment layers. Specifically, the alignment layers formed using the present invention can be made thinner and are more uniform than conventional alignment layers. For example, using the process of the present invention, alignment layers can be made as thin as 5 to 50 Angstroms as opposed to 800 to 3000 angstroms for conventional alignment layers. Very thin alignment layers have many advantages over the thicker PI alignment layers, for example, the voltage drop across the alignment layer is significantly lower in a thin alignment layer. In addition, the thin alignment layer does not require a PI alignment mask, which are very expensive. Furthermore, the chance of contamination is greatly reduced by using vapor deposition rather than liquid coatings.

The substrate surface cleanness plays an important role on the coated film adhesive strength on the substrate surface. Conventional plasma cleaning methods and conventional substrate cleaning methods that are used in the TFT/LCD industry can be used to clean the substrate prior to the beginning of process 300a. Plasma cleaning can be performed in a separate plasma cleaning system before the loading of wafer to the vapor deposition system (i.e. LOAD WAFER INTO CASSETTE 302). Alternatively, plasma cleaning can be incorporated into the vapor deposition system as an in-site system so that a plasma clean process is performed before the vapor deposition process (i.e. FIRST VAPOR DEPOSITION 316a).

The substrate surface material also plays an important role on the coated film adhesive strength on the substrate surface. In general, silicon based materials, such as $SiO_2$ (silicon dioxide), SiO (silicon monoxide) and SiOx (silicon Oxide), $Si_3N_4$, SiNx (silicon nitride), and SiOxNy (silicon oxynitride), are excellent materials with good adhesive strength to the silane material. Thus, a thin layer of these materials is a suitable material as the substrate surface materials for embodiments of the present invention. For example, in one embodiment of the present invention a thin adhesion layer is deposited over the substrate coated with ITO layer to promote the silane material coating on the ITO substrate surface. The thin adhesion layer can be any of the silicon-based materials described above.

While using a specialized Vacuum-bake/vapor prime coating machines as described above provides many advantages, embodiments of the present invention can also be carried out in less sophisticated equipment. For example conventional equipment used to deposit HMDS (Hexamethyldisilazane) (as the photo resist adhesive promoter) in conventional photo resist processes can be used to implement some embodiments of the present invention. The LPCVD (low pressure chemical vapor deposition) process or a simple vapor deposition process is used for the HMDS deposition. However, HMDS is not used as the LC alignment layer for the MVALCDs because HMDS produces a parallel, non-vertical, LC alignment layers. Furthermore, HMDS does not adhere to ITO layer. However, the process used to deposit HMDS can be used to deposit other silane materials with corresponding pressures, temperature, and time adjustments.

Figure 4:
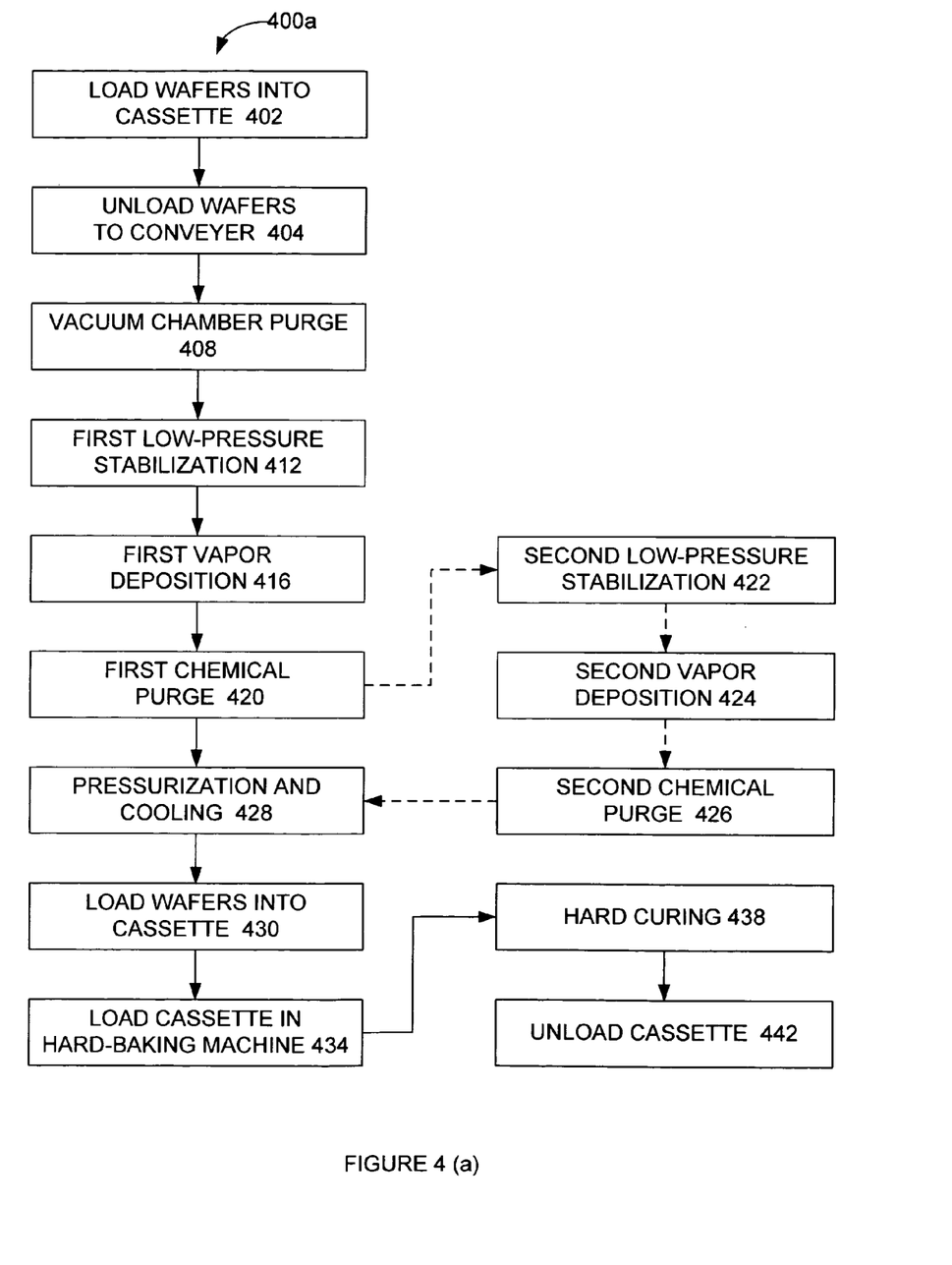
FIGS. 4(a) and 4(b) are two process flow diagrams of two processes to create an alignment layer for a MVA liquid crystal display in accordance with two embodiments of the present invention.

FIG. 4 is a process flow diagram of a novel process 400a to fabricate a liquid crystal alignment layer for MVALCD in accordance with one embodiment of the present invention. Novel process 400a can performed using a conventional equipment, such as the HMDS deposition system from Tokyo Ohka Kogyo CO., LTD, of Tokyo, Japan, Active CO., LTD of Sakitama, Japan, Tokyo Electron of Tokyo, Japan; and Aviza Technology of San Francisco, Calif. In general, the HMDS deposition systems processes wafers serially, that is, the HMDS deposition systems performs the silane vapor deposition serially. Additional equipment is used to perform hard curing as a batch process.

Novel Process 400a is similar to novel process 300a; however, due to limitations of conventional equipment additional steps are necessary to properly cure the alignment layers. The wafers are initially loaded into a Cassette in LOAD WAFERS INTO CASETTE 402. Then the wafers are unloaded serially onto a conveyer, which will load the wafers serially into a vacuum chamber, in UNLOAD WAFERS TO CONVEYER 404. In VACUUM CHAMBER PURGE 308, a vacuum chamber purge process is performed to completely remove water vapor that may be present in the vacuum chamber or the wafers. Specifically, the vacuum chamber is evacuated to a low pressure, such as 10-30 millitorrs, and refilled with a pre-heated inert gas, such as nitrogen, at a temperature of 80-200° C. The evacuation/refilling with nitrogen can be repeated several times to insure complete removal of water vapor from the vacuum chamber. Furthermore, due to the preheated inert gas and by the thermal heating element in the oven, the wafers are brought to a temperature that facilitates vapor deposition (as described below).

Then, in FIRST LOW-PRESSURE STABILIZATION 412, the vacuum chamber is held at a low pressure (for example 1 torr) for approximately 10 minutes. FIRST LOW-PRESSURE STABILIZATION 412 allows the entire wafer to be heated to the same temperature. Thus, thicker wafers should be held in the low-pressure process longer than thinner wafers.

The actual alignment layer is formed in FIRST VAPOR DEPOSITION 416a and an optional SECOND VAPOR DEPOSITION 424a (described below). Specifically, silane chemicals are pumped directly from a source bottle to the vaporization chamber. To minimize chemical degradation, the source bottle could be evacuated of gasses and filled with an inert gas, such as nitrogen, prior to transference of the silane chemicals to the vaporization chamber. The parameters used in FIRST VAPOR DEPOSITION 416a vary depending on the chemicals used. However, typical times and temperature are 5 to 10 minutes at 150 degrees Celsius. During FIRST VAPOR DEPOSITION 416a the chemical or chemicals are introduced by metered amount to the vapor flask and immediately to the chamber. As described above with respect to FIG. 3(a), various silane materials can be used, such as amino silanes, epoxy silanes, and mercapto silanes.

After FIRST VAPOR DEPOSITION 416a, the vacuum chamber is purged of chemicals in FIRST CHEMICAL PURGE 420. Specifically, the vacuum chamber is purged and refilled with an inert gas, such as nitrogen, several times to remove the vapors. A vapor trap on the vacuum exhaust line can be used to prevent silane chemicals from entering the vacuum pump. If a second vapor deposition step (i.e., SECOND VAPOR DEPOSITION 424a), is not used, the vacuum chamber is brought to normal pressurization and allowed to cool if necessary in PRESSURIZATION AN COOLING 428. Then, the cassettes are loaded into a cassette by a loading/unloading machine in LOAD WAFERS INTO CASSETTE 430

However, if a second vapor deposition step is desired, the vacuum chamber is evacuated and held at a low pressure (for example 1 torr) for approximately 10 minutes in SECOND LOW-PRESSURE STABILIZATION 422. SECOND LOW-PRESSURE STABILIZATION 432 allows the entire wafer to be heated to the same temperature. In SECOND VAPOR DEPOSITION 424a, chemicals are pumped directly from a source bottle to the vaporization chamber in the same manner as described above with respect to FIRST VAPOR DEPOSITION 416a.

After SECOND VAPOR DEPOSITION 424a, the vacuum chamber is purged of chemicals in SECOND CHEMICAL PURGE 426. Specifically, the vacuum chamber is purged and refilled with an inert gas, such as nitrogen, several times to remove the vapors. The vacuum chamber is brought to normal pressurization and allowed to cool if necessary in PRESSURIZATION AN COOLING 428. Then, the wafers are loaded into a cassette by a loading/unloading machine in LOAD WAFERS INTO CASSETTE 430.

The cassette containing the wafers are then loaded into a hard baking machine in LOAD CASSETTE IN HARD-BAKING MACHINE 434. In the hard backing machine the alignment layers are hard cured in HARD CURING 438. Specifically, the hard curing is performed in a hard curing oven, with a temperature of 80-200° C., for 30-120 minutes. Hard curing ovens are available from ESPEC Corp, Osaka, Japan, Yamato Scientific Co., Ltd, Tokyo, Japan, CSUN Manufacturing Ltd. of Taipei, Taiwan, and Contrel Corporation, Tainaung, Taiwan. Finally, the finished wafers in the cassette are unloaded in UNLOAD CASETTE 442.

As with process 300a, plasma cleaning or other substrate cleaning methods can also be used with process 400a. Some embodiments of the invention perform the cleaning prior to beginning process 400a while others embodiments of the present invention incorporate plasma or substrate cleaning prior to first vapor deposition 416a. For example, FIG. 4(b) shows a process 400b that includes plasma cleaning and plasma enhanced vapor deposition. Because process 400b is similar to process 400a of FIG. 4(a) only the differences are described. Specifically, after VACUUM CHAMBER PURGE 408, the vacuum chamber is held at a low pressure (for example, 100 millitorrs to 300 millitorrs) for approximately 10-20 minutes in PLASMA LOW-PRESSURE STABILIZATION 409 in preparation for plasma cleaning. Then, in PLASMA CLEANING 410 a plasma cleaning process, such as those described above, is carried out to clean the substrates. Furthermore, process 400b replaces FIRST VAPOR DEPOSITION 416a is replaced by FIRST PLASMA ENHANCED VAPOR DEPOSITION 416b and SECOND VAPOR DEPOSITION 424a is replaced by SECOND PLASMA ENHANCED VAPOR DEPOSITION 424b. The plasma enhanced vapor deposition process is described above.

The present invention can also be used for LCDs that require a parallel aligned liquid crystals, i.e. alignment layers that hold liquid crystals with an orientation parallel to the substrate surface when no voltage is applied across the liquid crystals. The appropriate materials for this parallel liquid crystal alignment include hexamethyldisilazane $C_6H_{19}Si_2N$, various dichlorosilanes derivatives (such as dimethyl dichlorosilanes, diphenyl dichlorosilanes), various trichlorosilanes derivatives (such as Methyl trichlorosilanes, Methyl trichlorosilanes, Ethyl trichlorosilanes, Phenyl trichlorosilanes, Vinyl trichlorosilanes, Stearyl trichlorosilanes), Dimethyl DES, various trimethoxysilane derivative (such as Methyl trimethoxysilane, Vinyl trimethoxysilane, 3-Aminopropyl trimethoxysilane, N-3-Aminoethyl-3-Aminoproply trimethoxysilane). In general, the resulting liquid crystal alignment depends on the LC material, the alignment layer material and the deposition condition. In one embodiment of the present invention, both substrates surfaces are treated with this parallel alignment. This type of surface treatment is applicable to LCDs that used a Guest-Host LC material, a cholesterol liquid crystal materials, or cholesteric polymeric liquid crystal materials. In another embodiment of the present invention, hybrid alignment layer LCDs are fabricated where one substrate is a vertical LC alignment, and the other substrate is a parallel LC alignment. This type of hybrid surface treatment is applicable to LCDs that are used a nematic liquid crystal materials, or Guest-Host LC materials.

Another benefit that can be derived from the present invention is improved anchoring strength of the LC alignment layer. Specifically, for the parallel alignment materials, the thickness of the coated material is very thin, however, the anchoring strength of the resulting LC alignment is very strong. Therefore, the materials can be used to over-coat on other LC alignment layers to improve the LC alignment anchoring strength while maintaining the same LC alignment angle. For the vertical alignment materials, the thickness of the coated material is also very thin and the anchoring strength of the resulting LC alignment is also very strong. Therefore, the vertical alignment materials can also be used to over-coat on other LC alignment layers to improve the LC alignment anchoring strength with the complimentary LC alignment angle. In addition, many of the materials used with embodiments of the present material have low permeability to water and water vapor. Thus the alignment layer can also act as a humidity barrier layer. Alternatively, the methods of the present invention can be used to form dedicated humidity barrier layers.

The present invention can also be used for LCDs that require pre-tilted liquid crystals, i.e. alignment layers that hold liquid crystals in a slightly tilted state even when no voltage is applied across the liquid crystals. In one embodiment of the present invention, a photosensitive material and a photo-alignment process is used to fabricate LC alignment with a tilted alignment and a homogenous planer LC alignment. These LC alignments can be used to fabricate single domain and multi-domain TN (twisted nematic), ECB (electrically-induced birefringence mode), IPS (in-plane switching) and MVA LCDs. The present invention can also be used to fabricate both alignment layers of hybrid LCDs, where one substrate is a vertical LC alignment, and the other substrate is a parallel LC alignment or a tilted parallel LC alignment. The present invention can also be used to fabricate the liquid crystal alignment layer and humility barrier layer for plastic substrate LCDs.

In the various embodiments of the present invention, novel structures and methods have been described for creating an alignment layer for liquid crystal displays. The various embodiments of the structures and methods of this invention that are described above are illustrative only of the principles of this invention and are not intended to limit the scope of the invention to the particular embodiments described. For example, in view of this disclosure those skilled in the art can define other vacuum chamber purge processes, low pressure stabilization processes, vapor deposition processes, chemical purge processes, chemicals, ovens, vacuum chambers, vacuum-bake/vapor prime coating machine, and so forth, and use these alternative features to create a method, or system according to the principles of this invention. Thus, the invention is limited only by the following claims.

What is claimed is:

1. A method to form a liquid crystal alignment layer on a substrate of a LCD, the method comprising:
   placing the substrate in a vacuum chamber;
   purging the vacuum chamber; and
   depositing the liquid crystal alignment layer using vapor deposition of a silane material, further comprising vaporizing a chemical, wherein the chemical comprises perfluorooctyltriethoxysilane.

2. The method of claim 1, wherein depositing the liquid crystal alignment layer using vapor deposition comprises depositing the alignment layer using chemical vapor deposition.

3. The method of claim 1, wherein the depositing the liquid crystal alignment layer using vapor deposition further comprises depositing the alignment layer using plasma-enhanced vapor deposition.

4. The method of claim 3, wherein a plasma source used in the plasma-enhanced vapor deposition is located outside the vacuum chamber.

5. The method of claim 1, wherein the purging the vacuum chamber removes water vapor from the vacuum chamber.

6. The method of claim 1, wherein the purging the vacuum chamber further comprises:
   evacuating the vacuum chamber to a low pressure; and
   refilling the vacuum chamber with an inert gas.

7. The method of claim 6, wherein the purging the vacuum chamber further comprises:
   evacuating the vacuum chamber to a low pressure for a second time; and
   refilling the vacuum chamber with the inert gas for a second time.

8. The method of claim 6, wherein the inert gas is preheated to a temperature between 80 and 200° C., inclusive.

9. The method of claim 6, wherein the inert gas is nitrogen.

10. The method of claim 6, wherein the low pressure between 10 and 30 millitorrs, inclusive.

11. The method of claim 1, further comprising performing low-pressure stabilization on the substrate.

12. The method of claim 11, wherein the performing low pressure stabilization comprises:
evacuating the vacuum chamber to a low pressure; and
maintaining the low pressure for a time period.

13. The method of claim 12, wherein the low pressure is approximately 1 torr and the time period is approximately 10 minutes.

14. The method of claim 1, wherein the depositing the liquid crystal alignment layer using vapor deposition, further comprises:
evacuating gasses from a source bottle containing the chemical; and
filling the source bottle with an inert gas.

15. The method of claim 1, wherein the chemical comprises Octyltriethoxysilane.

16. The method of claim 1, wherein the chemical comprises Trichlorosilane.

17. The method of claim 1, wherein the chemical comprises a fluorinated polymer material.

18. The method of claim 17, wherein the fluorinated polymer material is $(CF_2-)_n$.

19. The method of claim 1, further comprising purging the vacuum chamber after depositing the liquid crystal alignment layer using vapor deposition.

20. The method of claim 19, wherein the purging the vacuum chamber further comprises:
evacuating the vacuum chamber; and
filling the vacuum chamber with an inert gas.

21. The method of claim 1, wherein the liquid crystal alignment layer has a thickness of less than 800 Angstrom.

22. The method of claim 1, wherein the liquid crystal alignment layer has a thickness of less than 50 Angstroms.

23. The method of claim 1, further comprising hard curing the substrate after depositing the liquid crystal alignment layer using vapor deposition.

24. The method of claim 23, further comprising loading the substrate in a cassette.

25. The method of claim 24, further comprising loading the cassette in an oven.

26. The method of claim 23, wherein the hard curing is performed between 80-200° C.

27. The method of claim 23, wherein the hard curing is performed for 30 to 120 minutes.

28. The method of claim 1, further comprising cleaning the substrate prior to placing the substrate in a vacuum chamber.

29. The method of claim 27, wherein the cleaning the substrate comprises plasma cleaning the substrate.

30. The method of claim 1, further comprising cleaning the substrate prior to depositing the liquid crystal alignment layer using vapor deposition.

31. The method of claim 30, wherein the cleaning the substrate comprises plasma cleaning the substrate.

32. The method of claim 31, wherein the plasma cleaning and occurs in the vacuum chamber.

33. The method of claim 31, wherein further comprising a plasma low-pressure stabilization prior to the plasma cleaning.

34. The method of claim 1, further comprising depositing a thin adhesion layer prior to depositing the liquid crystal alignment layer using vapor deposition.

35. The method of claim 34, wherein the thin adhesion layer comprises a silicon based material.

36. The method of claim 35, wherein the silicon based material comprises silicon oxide.

37. The method of claim 35, wherein the silicon based material comprises silicon nitride.

38. The method claim 35, wherein the silicon based material comprises silicon oxynitride.

39. The method of claim 1, wherein the liquid crystal alignment layer has a low permeability to water and water vapor.

40. The method of claim 1, wherein the liquid crystal alignment layer is also a humidity barrier layer.

* * * * *